United States Patent [19]
Herrmann

[11] Patent Number: 5,506,906
[45] Date of Patent: Apr. 9, 1996

[54] RADIO RECEIVER STATION-SEEKER STOP-SIGNAL GENERATOR

[75] Inventor: Matthias Herrmann, Hildesheim, Germany

[73] Assignee: Blaupunkt-Werke GmbH, Hildesheim, Germany

[21] Appl. No.: 218,660

[22] Filed: Mar. 28, 1994

[30] Foreign Application Priority Data

Apr. 10, 1993 [DE] Germany ............................ 43 11 933.6

[51] Int. Cl.⁶ ................................. H04H 5/00; H04B 1/18
[52] U.S. Cl. ............................ 381/4; 381/13; 455/161.1; 455/161.3; 455/226.2
[58] Field of Search .................. 381/4, 2, 13; 455/161.3, 455/160.1, 161.1, 161.2, 164.1, 164.2, 165.1, 169.1, 173.1, 226.1, 226.2; 375/117, 97, 98

[56] References Cited

U.S. PATENT DOCUMENTS

| 3,714,580 | 1/1973 | Close ..................... 455/169.1 |
| 4,262,363 | 4/1981 | Wiechmann et al. ......... 455/161.3 |
| 4,387,469 | 1/1983 | Miyazaki et al. ........... 455/161.3 |
| 4,450,586 | 5/1984 | Fujino .................... 445/161.3 |
| 4,509,204 | 4/1985 | Wile ...................... 445/169.1 |
| 4,580,285 | 4/1986 | Richards, Jr. ............. 455/161.3 |
| 4,709,406 | 11/1987 | Omoto .................... 455/182.2 |
| 5,073,975 | 12/1991 | Zarabadi et al. ........... 455/161.3 |
| 5,077,827 | 12/1991 | Messerschmidt et al. ..... 455/166 |
| 5,125,105 | 1/1992 | Kennedy et al. ............ 381/13 |
| 5,239,684 | 8/1993 | Ishikura .................. 455/226.2 |
| 5,355,526 | 10/1994 | Berninger ................. 455/161.3 |

FOREIGN PATENT DOCUMENTS

| 2724068 | 5/1977 | Germany .................. 455/161.3 |
| 2035736 | 6/1980 | United Kingdom ........... 455/169 |
| 2100084 | 12/1982 | United Kingdom . |

OTHER PUBLICATIONS

Roland E. Best, "Designing FIR filters with the Parks–McClellan algorithm," in *Phase–Locked Loops*, 2nd edition, McGraw–Hill, Inc., New York, 1993, pp. 335–338 & 362–368.

Primary Examiner—Forester W. Isen
Assistant Examiner—Xu Mei
Attorney, Agent, or Firm—Frishauf, Holtz, Goodman, Langer & Chick

[57] ABSTRACT

Radio receivers which scan through a predetermined band of the radio spectrum, in a station-seeking mode, must independently detect whether the currently tuned frequency is the central frequency of the transmitting station and whether this transmitter provides a signal whose strength is sufficient, i.e. whose strength exceeds a predetermined threshold value. Once these two conditions are satisfied, the radio generates a "stop" signal which terminates the station-seeking mode, i.e. keeps the tuning circuit set to the frequency which provided the sufficiently strong signal. The present invention provides an unusually simple way to determine whether these two conditions are satisfied, by using a Finite-Impulse-Response digital filter (2) to extract a d.c. component of the demodulated signal (MPX), for comparison (6) with a predetermined maximum value, and by filtering (10) a field strength signal (FST), for comparison (11) with a predetermined minimum value. When both conditions are satisfied, a simple AND-gate (8) generates the stop-signal.

9 Claims, 3 Drawing Sheets

RADIO RECEIVER STATION-SEEKER STOP-SIGNAL GENERATOR

Cross-reference to related patent applications, assigned to the assignee of the present application, the disclosures of which are incorporated by reference: U.S. Ser. No. 08/183,029, filed Jan. 18, 1994, and U.S. Ser. No. 08/218,651, filed Mar. 28, 1994.

FIELD OF THE INVENTION

The present invention relates generally to radio receivers with automatic station-seeking capability and, more particularly, to a circuit which demodulates a sequence of received transmitter signals and determines whether each transmitting station provides a sufficiently strong signal.

BACKGROUND

Radio receivers which scan through a predetermined band of the radio spectrum, in a station-seeking mode, must independently detect whether the currently tuned frequency is the central frequency of the transmitting station and whether this transmitter provides a signal whose strength is sufficient, i.e. whose strength exceeds a predetermined threshold value. Once these two conditions are satisfied, the radio generates a "stop" signal which terminates the station-seeking mode, i.e. keeps the tuning circuit set to the frequency which provided the sufficiently strong signal.

SUMMARY OF THE INVENTION

It is an object of the present invention to provide as simple as possible a circuit which determines whether these conditions are satisfied, and which is adapted for processing of a digital demodulated signal.

Briefly, this is accomplished by generating a stop-signal whenever the d.c. component of the demodulated signal is below a first predetermined value and the field strength is above a second predetermined value. Preferably, the demodulated signal is a stereo multiplex signal.

In the case of digital signal processing, the d.c. component is preferably derived by low-pass filtering and taking the absolute value of the filter output signal.

In receivers having digital signal processing, a high sampling rate in the demodulating stage is desirable. One refinement or embodiment of the invention therefore provides that the stereo multiplex signal, in digital form, is provided with a first sampling rate, which is reduced to a second sampling rate, the first sampling rate being an integer multiple of the second sampling rate.

In this connection, preferably the circuit includes a Finite-Impulse-Response (FIR) low-pass filter upstream of the sampling rate reduction. In the FIR filter, a plurality of signals with coefficients are added in a weighted manner, the signals each being delayed with respect to each other by one sampling period, defined as one period of the first sampling rate. The count of the plurality of signals equals the integer ratio of the first sampling rate to the second sampling rate.

This has the advantage that the measurement of the d.c. component is not falsified or distorted, even if one uses other filters for decimation, which other filters would otherwise tend to reflect higher-frequency components into the lower frequency range, and thus into the d.c. component which is intended for subsequent evaluation.

In a preferred embodiment, the first sampling rate is 228 kHz, the second sampling rate is 9.5 kHz, and 23 delay elements are used, resulting in a count of 24 signals added in the filter. This works well with broadcast 57 kHz subcarriers.

BRIEF FIGURE DESCRIPTION

Embodiments of the invention are illustrated in the accompanying figures, of which:

FIG. 1 is a block diagram of the stop-signal generating circuit of the present invention;

FIG. 2 schematically illustrates a first low-pass filter used in the circuit of FIG. 1; and FIG. 3 schematically illustrates further low-pass filters used in the circuit of FIG. 1.

DETAILED DESCRIPTION

Figure 1:
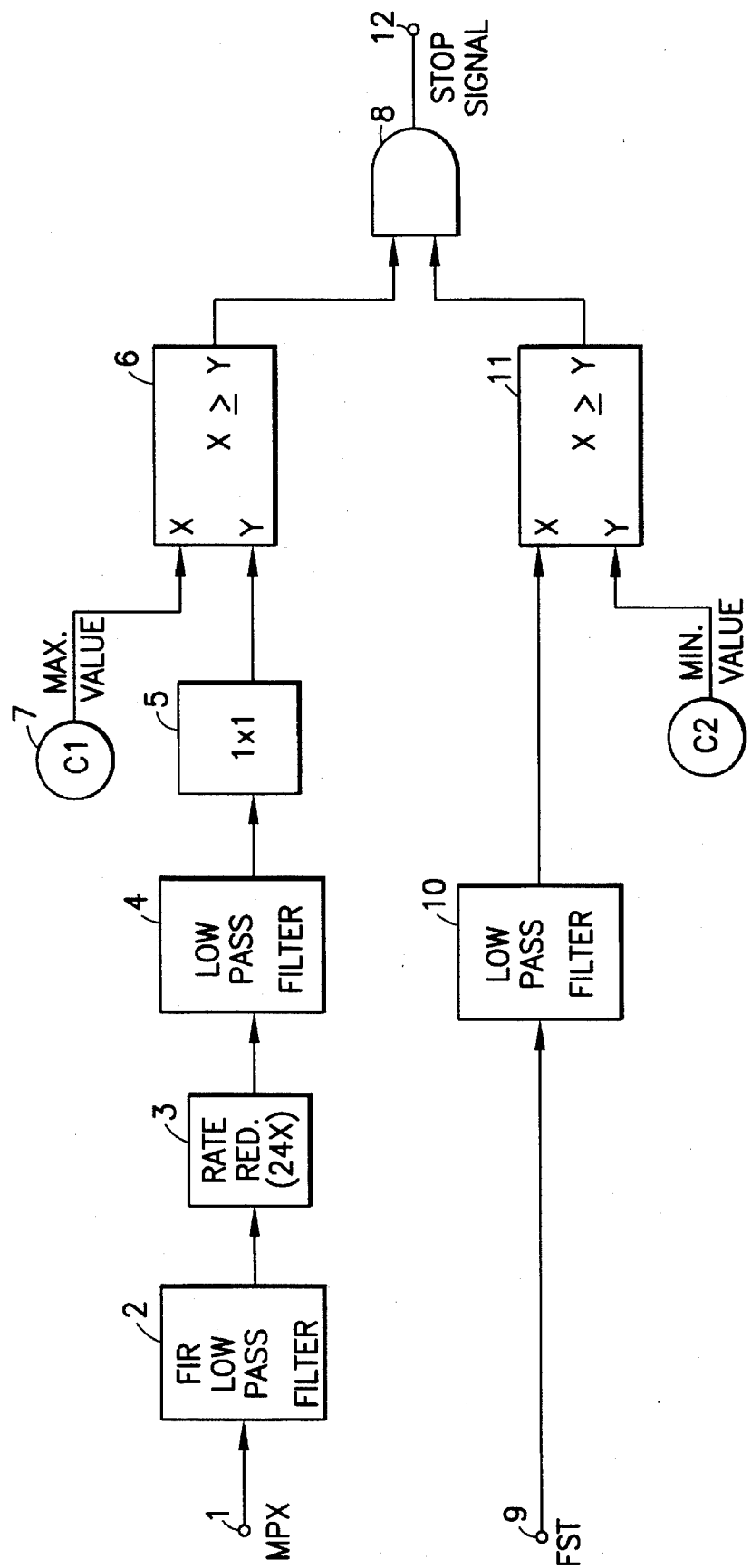

FIG. 1 illustrates a circuit to which a stereo multiplex signal MPX, having a 228 kHz sampling rate, is supplied at terminal 1. As discussed above, the 228 kHz rate has proven to be advantageous for digital signal processing; for example, at 228 kHz, one can sample each cycle of a broadcast 57 kHz signal four times, commonly referred to as 4X oversampling. Using the present invention, a significantly lower sampling rate suffices, so the stereo multiplex signal MPX is fed through a low-pass filter 2 to a circuit 3 for sampling-rate reduction by a factor of 24. The resulting signal is fed to a further low-pass filter 4, whose limit frequency is very low, so that at filter 4's output, practically only the d.c. component results, whose magnitude is measured at an absolute value stage 5. The output of stage 5 is fed to one input (y) of a comparator 6, which compares it with constants C1 of, for example, 0.07 (defined with respect to the maximum amplitude), which constant values are introduced at a second input 7 of comparator 6. If the magnitude of the d.c. component is smaller than constant C1, there is generated, at output $x \geq y$ of comparator 6, a logical 1 (HIGH) signal, which is fed to a first input of an AND-gate 8.

FIG. 1, left side, illustrates a second input 9 of the circuit, at which a Field STrength signal FST, representing the field strength of the currently received broadcast signal, is applied. This signal passes through a low-pass filter 10 and is compared, in a comparator 11, to constants C2. If the field strength is greater than a predetermined value specified by constant C2, there appears, at the output $x \geq y$ of comparator 11, a logical 1 (HIGH) which is fed to the other input of the aforementioned AND-gate 8. If both comparators 6 and 11 indicated satisfied conditions, the stop-signal SLS at output 12 of AND-gate 8 takes on the value logical 1 (HIGH).

Figure 2:
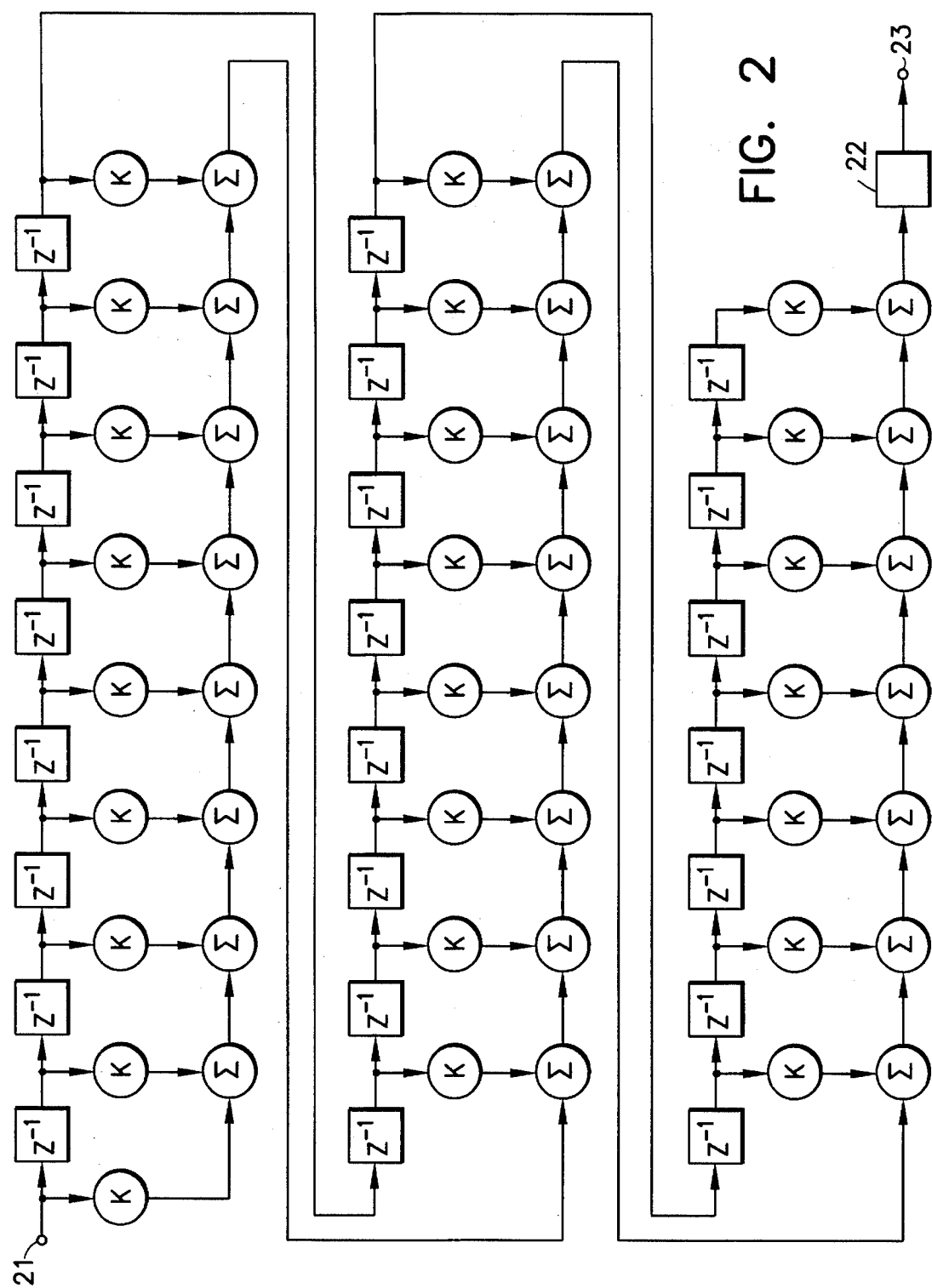

FIG. 2 illustrates a preferred embodiment of low-pass filter 2 shown in FIG. 1. It is constructed as a Finite Impulse Response (FIR) filter of the 23rd order and has the special characteristics of a comb filter. The stereo multiplex signal supplied at input 21 is delayed 23 times, each time by one sampling interval or period ($z^{-1}$). At each nth intermediate point, the (undelayed) input signal MPX and the respective n-times-delayed input signal are multiplied by a coefficient K, whose value in the preferred embodiment is $1/24$. While the input signal MPX has a width or precision of 16 bits, the products of the delayed signals with the coefficients are 24-bit-wide intermediate signals, in order to minimized quantization error. The products of the multiplications are summed, in a summing circuit, and, after a format transformation at stage 22, reach output 23, where they represent the low-pass-filtered stereo multiplex signal with a bit-width of 16.

Figure 3:
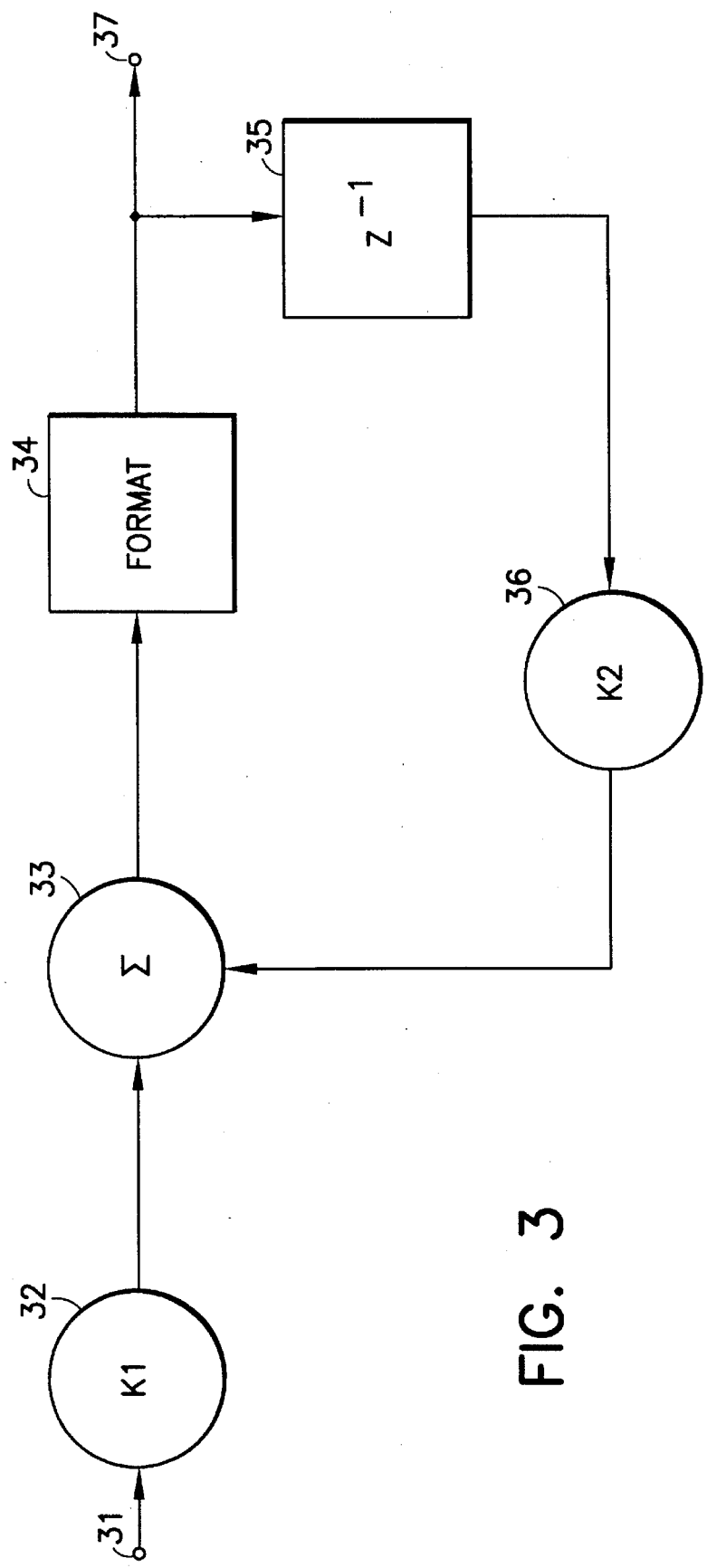

FIG. 3 illustrates an exemplary embodiment of one of filters 4 or 10, constructed as a recursive filter of the 1st order. At input 31, one applies either the stereo multiplex signal MPX after its rate reduction or the field strength signal FST. Both signals are initially multiplied at 32 by a first constant K1. The output signal of multiplier 32 is a 24-bit-wide signal, which is fed to an adder circuit 33. After a format transformation at stage 34 into a 16-bit-wide signal, the sum is delayed at a delay stage 35 by one sampling interval, weighted at stage 36 using a second constant K2, and fed to a second input of adder circuit 33. At an output terminal 37, connected to the output of format stage 34, one can pick up the filtered signal, which represents, in the case of filter 4, the d.c. component of the stereo multiplex signal or, in the case of filter 10, represents the low-pass filtered field strength signal.

Examples of 57 kHz broadcast signals are set forth in U.S. Pat. No. 4,862,513, Bragas, issued Aug. 29, 1989, entitled RADIO RECEIVER WITH TWO DIFFERENT TRAFFIC INFORMATION DECODERS.

Various changes and modifications are possible within the scope of the inventive concept.

What is claimed is:

1. A circuit for generating a stop-signal in a station-seeking portion of a radio receiver having means for deriving a received signal and means for generating a received-signal field strength signal (FST), said circuit comprising means having an input (1) receiving said received signal;

means for digitally demodulating the received signal at a first sampling rate and providing a demodulated signal;

means for sampling the demodulated signal at a second sampling rate, which is lower than said first sampling rate and providing a sampled signal;

a low-pass filter (4) coupled to receive the sampled signal and deriving a d.c. component value (Y) from the sampled signal;

first comparing means (6) comparing said d.c. component value (Y) with a first comparison value (C1) and providing a first output representative of the result of said comparison when said d.c. component value (Y) is below said first comparison value;

second comparing means (11), having an input (9) receiving said field strength signal (FST), for comparing said field strength signal to a predetermined minimum field strength value (C2) and providing a second output when said field strength signal exceeds said predetermined minimum field strength value (C2; and logic means (8), having inputs connected to the first output of said first comparing means (6) and the second output of said second comparing means (11), and generating (12) said stop-signal whenever said d.c. component value is below said first comparison value, and said field strength signal exceeds said predetermined minimum field strength value (C2).

2. The circuit of claim 1, including an absolute value measuring stage (5) coupled to the low-pass filter (4) to form, together with said low-pass filter (4), a d.c. component value deriving means.

3. The circuit of claim 1, wherein said demodulated signal is a stereo multiplex signal.

4. The circuit of claim 3, including an absolute value measuring stage (5) coupled to the low-pass filter (4) to form, together with said low-pass filter (4), a d.c. component value deriving means.

5. The circuit of claim 1, wherein said first sampling rate represents an oversampling of a received broadcast signal, and said second sampling rate is a lower frequency than the frequency of said received broadcast signal.

6. The circuit of claim 5, wherein said first sampling rate is 228 kHz;

said received broadcast signal has a frequency of 57 kHz and said second sampling rate is 9.5 kHz.

7. The circuit of claim 1, wherein said first sampling rate is an integer multiple of said second sampling rate; and said integer multiple is 24, and said d.c. component deriving means includes 23 delay elements.

8. The circuit of claim 1, wherein said first sampling rate is an integer multiple of said second sampling rate; and said d.c. component deriving means includes a Finite-Impulse-Response (FIR) digital filter (2) in which a series of delay elements each retard their respective input signal by one period of said first sampling rate, each output signal of a delay element is multiplied by a coefficient (K) to form a respective intermediate signal, said respective intermediate signals are summed; and said integer multiple is equal to a count of said FIR filter input signal and said respective intermediate signals.

9. The circuit of claim 8, wherein said integer multiple is 24.

* * * * *